(12) United States Patent
Hiranuma

(10) Patent No.: US 8,636,404 B2
(45) Date of Patent: Jan. 28, 2014

(54) TIMEPIECE

(75) Inventor: Haruki Hiranuma, Chiba (JP)

(73) Assignee: Seiko Instruments Inc. (JP)

( * ) Notice: Subject to any disclaimer, the term of this patent is extended or adjusted under 35 U.S.C. 154(b) by 160 days.

(21) Appl. No.: 13/373,375

(22) Filed: Nov. 10, 2011

(65) Prior Publication Data

US 2012/0120777 A1    May 17, 2012

(30) Foreign Application Priority Data

Nov. 17, 2010   (JP) .................................. 2010-257223

(51) Int. Cl.
*G04B 37/00*   (2006.01)

(52) U.S. Cl.
CPC ..................................... *G04B 37/52* (2013.01)
USPC .......................................... 368/300; 368/287

(58) Field of Classification Search
USPC ............................. 368/300, 299, 287, 88, 281
See application file for complete search history.

(56) References Cited

U.S. PATENT DOCUMENTS

| | | | | |
|---|---|---|---|---|
| 3,492,810 A | * | 2/1970 | Levrat | 368/287 |
| 3,735,584 A | * | 5/1973 | Tokunaga | 368/287 |
| 3,855,786 A | * | 12/1974 | Yamamoto | 368/287 |
| 5,442,602 A | * | 8/1995 | Hirai et al. | 368/286 |
| 6,762,976 B1 | * | 7/2004 | Tamaru et al. | 368/88 |
| 2005/0007891 A1 | * | 1/2005 | Hiranuma et al. | 368/318 |
| 2005/0013204 A1 | * | 1/2005 | Hiranuma et al. | 368/295 |
| 2006/0164924 A1 | * | 7/2006 | Arai et al. | 368/281 |
| 2006/0187766 A1 | * | 8/2006 | Hiranuma et al. | 368/319 |
| 2008/0101165 A1 | * | 5/2008 | Cretin et al. | 368/297 |

FOREIGN PATENT DOCUMENTS

| | | |
|---|---|---|
| JP | 2000162332 | 6/2000 |
| WO | WO 2010019028 A1 * | 2/2010 |

* cited by examiner

*Primary Examiner* — Amy Cohen Johnson
*Assistant Examiner* — Matthew Powell
(74) *Attorney, Agent, or Firm* — Adams & Wilks

(57) ABSTRACT

A wristwatch includes a case formed of a glass and a back lid attached to a case body that has an annular receiving portion on an inner peripheral surface thereof. An inner frame is integrated into the case body by engaging an engaging portion of the inner frame with the annular receiving portion from the side of the back lid. A movement is supported inside the inner frame, and a plurality of resilient bodies are attached to the inner frame and project from the outer peripheral surface of the inner frame. The resilient bodies are clamped between the inner peripheral surface of the case body and the outer peripheral surface of the inner frame, and are resiliently deformed so as to match a gap between the inner peripheral surface and the outer peripheral surface.

16 Claims, 6 Drawing Sheets

TIMEPIECE

BACKGROUND OF THE INVENTION

1. Field of the Invention

The present invention relates to a timepiece such as portable watches having a movement disposed in a case via an inner frame.

2. Description of the Related Art

Although a movement of a timepiece generally is integrated in a case generally via an inner frame, various problems may be induced when the movement rattles.

From such circumstances, a timepiece configured to prevent rattling of the movement to enhance an anti-shock property by securing a metallic fixing strip having a tongue-shaped rigid body portion and a leaf spring shaped resilient body portion with a screw to the movement, accommodating a distal end portion of the resilient body portion of the fixing strip in a depression formed on an inner surface of the case in a state of the distal end portion having an initial deflection by being in press-contact with a flat-shaped receiving surface of the depression and also by accommodating a distal end portion of the rigid body portion of the fixing strip in the depression in a state of the distal end portion being apart from the receiving surface is known as a technology of the related art (for example, see JP-A-2000-162332 (Patent Document 1)).

A timepiece according to the related art is capable of preventing the movement from rattling and withstanding a considerable impact because the resilient body portion is resiliently deformed firstly to alleviate an impact force caused by an impact applied thereto in the event of falling or the like and then the impact is received with the rigid body portion in contact with the receiving surface of the depression.

However, although the technology described in Patent Document 1 is effective for preventing the movement from rattling in the direction of thickness of the timepiece, but is not very effective for preventing the movement from rattling in the radial direction of the timepiece in the event of falling of the timepiece. In addition, even though the distal end portion of the resilient body portion is resiliently in press contact with the depression, the spring property of the leaf spring shaped resilient body portion is deteriorated due to repeated use over the years and, in this case, the movement tends to rattle in the radial direction of the timepiece.

When such rattling is present, the impact on the movement becomes excessive, and hence the probability of damage of the movement is increased. In particular, in a case where the movement is a mechanical type and the inner frame which supports the movement is formed of a metal, the total weight of components which may rattle is increased and the impact force applied in the event of falling of the timepiece is also increased correspondingly, and hence the probability of damage of the movement is further improved.

Incidentally, the rattling of the movement in the radial direction does not occur with a configuration in which a gap between an outer peripheral surface of the inner frame which supports the movement and an inner peripheral surface of the case is eliminated by bringing these inner and outer peripheries are brought into tight contact with each other. However, in this configuration, assembly of the inner frame into the case becomes difficult as well as disassembly thereof becomes impossible, so that formation of a fitting gap between the outer peripheral surface of the inner frame and the inner peripheral surface of the case is actually inevitable. Therefore, it is difficult to prevent the movement from rattling in the radial direction caused by the gap and enhance the anti-shock property of the movement.

SUMMARY OF THE INVENTION

It is an object of the present invention to provide a timepiece which allows improvement of an anti-shock property of a movement in spite of the fact that assembly and disassembly are possible.

A timepiece according to the present invention includes: a case including a body having an annular receiving portion in an inner peripheral surface thereof, a glass attached to the body at one end portion in the thickness direction, and a back lid attached to the body at the other end portion in the thickness direction; an inner frame which has an engaging portion on an outer peripheral surface thereof and is integrated in the case by engaging the engaging portion with the receiving portion for the side of the back lid and by forming a gap between the inner peripheral surface and the outer peripheral surface; a movement supported inside the inner frame and integrated in the case; and a plurality of resilient bodies attached to a plurality of positions on the inner frame respectively so as to be capable of being resiliently deformed and project from the outer peripheral surface, and resiliently deformed so as to match the gap by being clamped between the inner peripheral surface and the outer peripheral surface.

In the present invention, the receiving portion of the body may be formed by an inward projecting portion, a shoulder, or the like integrally projecting inward of the body, and the back lid may be or may not be have a transparent member which allows seeing contents of the case therethrough. In addition, when the back lid includes the transparent member, and the timepiece is implemented as a skeleton type timepiece which allows seeing the inner frame through the transparent member, a viewable surface of the inner frame is preferably provided with decorative elements such as plating or engraving in order to further improve the design of the timepiece.

In the present invention, the engaging portion of the inner frame may be formed of the outward projecting portion or the shoulder or the like projecting outward from the outer peripheral surface of the inner frame. In the present invention, when the movement is a mechanical type, in general, the inner frame is preferably formed of a metal having higher robustness than synthetic resins so as to avoid deformation or damage of the inner frame or the like caused by the weight of the movement. However, the inner frame may be formed of a synthetic resin and, in this case, a synthetic resin having the same strength as metals may be employed. Also, in the present invention, although the mechanical type movement may be preferably used, and movements other than the mechanical type may also be used.

In the present invention, a plurality of the resilient bodies may be formed of synthetic resins such as polyacetal resins like DURACON (product name), or a hard rubber or the like. In the present invention, in the case of a configuration in which the resilient bodies do not point-contact with the inner peripheral surface of the body but contact over a predetermined length along the inner peripheral surface of the body (in other words, the resilient body has a buffering portion which forms an arcuate shape in plan view, and comes into contact along the inner peripheral surface of the body over a length corresponding to the shape of the buffering portion), at least two of the resilient bodies may be used. When two of the resilient bodies in this configuration are used, these two resilient bodies may be disposed on the inner frame, separated of 180 degrees in the circumferential direction of the inner frame. Also, when the resilient bodies have a configuration to point-contact with the inner peripheral surface of the body, it is preferable that at least three of the resilient bodies are used and these resilient bodies are disposed equidistantly in the circumferential direction of the inner frame.

In addition, in the present invention, each of the resilient bodies may be formed only of a buffering portion clamped between the inner peripheral surface of the body and the outer peripheral surface of the inner frame and attached to the outer peripheral surface of the inner frame by adhesion. However, the resilient body preferably has a configuration including a mounting portion with respect to the inner frame and the buffering portion resiliently deformed by being clamped between the inner peripheral surface of the body and the outer peripheral surface of the inner frame from a point that the resilient body can hardly be disconnected from the inner frame because the mounting portion is caught by the inner frame. Also, it is preferable that the buffering portion has a tapered shape to prevent the resilient body from easily caught by an opening edge on the side of the back lid of the body when assembling the inner frame by inserting the inner frame into the body, and the buffering portion has an inclined guide surface. In this case, the buffering portion may be formed into a semispherical shape, a trapezoidal shape, or a truncated conical shape.

Also, the present invention may be applied to a portable watch, for example, to a wrist watch, a pocket watch or the like and, when implemented as a wrist watch, the invention is suitably implemented as a wrist watch in the form of a diver's watch having a mechanical movement integrated therein.

In the present invention, a gap is formed between the outer peripheral surface of the inner frame which supports the movement and the inner peripheral surface of the body of the case in which the inner frame is integrated, and the resilient bodies clamped between the inner peripheral surface and the outer peripheral surface can be resiliently deformed. Therefore, in a state in which the back lid is not mounted on the body, the inner frame supporting the movement can be attached and detached with respect to the body while resiliently deforming the resilient bodies. In other words, the timepiece of the present invention can be disassembled and assembled.

In addition, according to the present invention, even though the gap is formed between the outer peripheral surface of the inner frame and the inner peripheral surface of the body, the inner peripheral surface and the outer peripheral surface clamp the resilient bodies attached to the inner frame in a state of the resilient bodies being resiliently deformed. Accordingly, the inner frame and the movement supported thereby are restrained from moving in the radial direction of the body with respect to the body due to the gap. Also, in the event of falling of the timepiece or the like, the impact resulted therefrom may be alleviated by the resilient deformation of the resilient bodies. Therefore, according to the timepiece of the present invention, improvement of the anti-shock property of the movement is achieved.

According to a preferred embodiment of the present invention, the inner frame includes a plurality of mounting bores extending in the radial direction thereof, the resilient bodies each include a base to be inserted into the mounting bore and a head having a diameter larger than the base and the mounting bore and provided integrally at one end of the base, and the resilient bodies are attached to the inner frame with the bases inserted into the mounting bores and the heads projected from the outer peripheral surface.

In this preferred embodiment, with a simple work of inserting the bases of the resilient bodies into the mounting bores of the inner frame, the resilient bodies may be attached to the inner frame without necessity of fixation with a screw or adhesion. Also, the resilient bodies attached to the inner frame can be prevented from being disconnected easily by the bases caught by the inner frame.

According to the preferred embodiment of the present invention, each of the bases is formed into a cylindrical shape having a hollow portion bottomed by the head, and the hollow portion is opened to the other end of the base.

In this preferred embodiment, since the bases are resiliently deformed easily by the presence of the hollow portions, a work of inserting the bases into the mounting bores of the inner frame is easy, and since the heads are resiliently deformed easily by the presence of the hollow portions which form the bottoms of the heads, the inner frame supporting the movement can be attached and detached easily with respect to the inside of the body when disassembling or assembling the timepiece.

According to the preferred embodiment of the present invention, the head has a semispherical shape.

In this preferred embodiment, when inserting the inner frame having the resilient bodies attached thereto into the body together with the movement, the heads of the resilient bodies can hardly be caught by the body. Also, since the contact of the heads with respect to the inner peripheral surface of the body is point contact, frictional resistance of the heads with respect to the inner peripheral surface of the body is small. Therefore, the inner frame can easily be detached and attached with respect to the inside of the body.

According to the preferred embodiment of the present invention, a resiliently deformable resilient member is clamped between the inner frame and the back lid in a state of the resilient member being resiliently deformed.

In this preferred embodiment, the resilient member may be attached to any one of the inner frame or the lid frame. The number of the resilient members used may be one when the resilient member is formed into an annular shape, may be at least two if the resilient members are formed into an arcuate shape having a predetermined length and coming into contact with the back lid or the inner frame, and may be at least three if the resilient members come into point-contact with the back lid or the inner frame. Also, the arrangement when two or more, or three or more of the resilient members are used may be the same as the arrangement when two or more, or three or more of the resilient bodies are used.

In this preferred embodiment, in addition to the stop of the movement of the inner frame in the radial direction of the body by the resilient bodies, the engaging portion of the inner frame is held by the resilient members in a state of the engaging portion being pressed against the receiving portion of the body so that the inner frame is restrained from moving in the direction of the thickness of the body. Also, the impact applied as a result of the falling or the like may be alleviated by the resilient deformation of the resilient members. Therefore, further improvement of the anti-shock property of the movement supported by the inner frame is achieved.

Also, according to the preferred embodiment of the present invention, the resilient member is attached by being inserted into a mounting hole provided on the inner frame.

In this preferred embodiment, since all the resilient bodies and the resilient members are attached to the inner frame, when confirming the number of the resilient bodies and the resilient members used, it is not necessary to prepare the back lid in addition to the inner frame for confirmation, so that the above-described conformation work cha be performed easily.

Also, according to the preferred embodiment of the present invention, the mounting hole and the mounting bore have the same diameter, and the resilient body and the resilient member have the same configuration.

In this preferred embodiment, the resilient bodies and the resilient members formed using the same molding die can be used, and the mounting bores and the mounting holes for attaching the resilient bodies and the resilient members can be machined on the inner frame using the same punching tool.

Also, according to the preferred embodiment of the present invention, the resilient member is integrally formed with the resilient body.

In this preferred embodiment, since the resilient bodies which serve to stop the movement of the inner frame in the radial direction of the body and the resilient members which serve to stop the movement of the inner frame in the thickness direction of the body are integrally formed, the number of components which serve to stop the movement of the inner frame can be reduced.

Also, according to the preferred embodiment of the present invention, the movement includes a switch, and a crown configured to operate the movement is attached to the case, and a push button positioned in the vicinity of the crown and configured to turn the switch ON is attached to the case.

In this preferred embodiment, the movement is restrained from moving in the radial direction in the case by a plurality of the resilient bodies irrespective of the pushing and pulling operation of the crown, and hence the positional relationship between the switch of the movement and the push button can be adequately maintained. Therefore, predetermined functions provided for the push button can be brought reliably into play by the operation to push the button inward.

According to the present invention, a timepiece which allows improvement of an anti-shock property of a movement in spite of the fact that assembly and disassembly are possible can be provided.

DETAILED DESCRIPTION OF THE PREFERRED EMBODIMENTS

Figure 1:
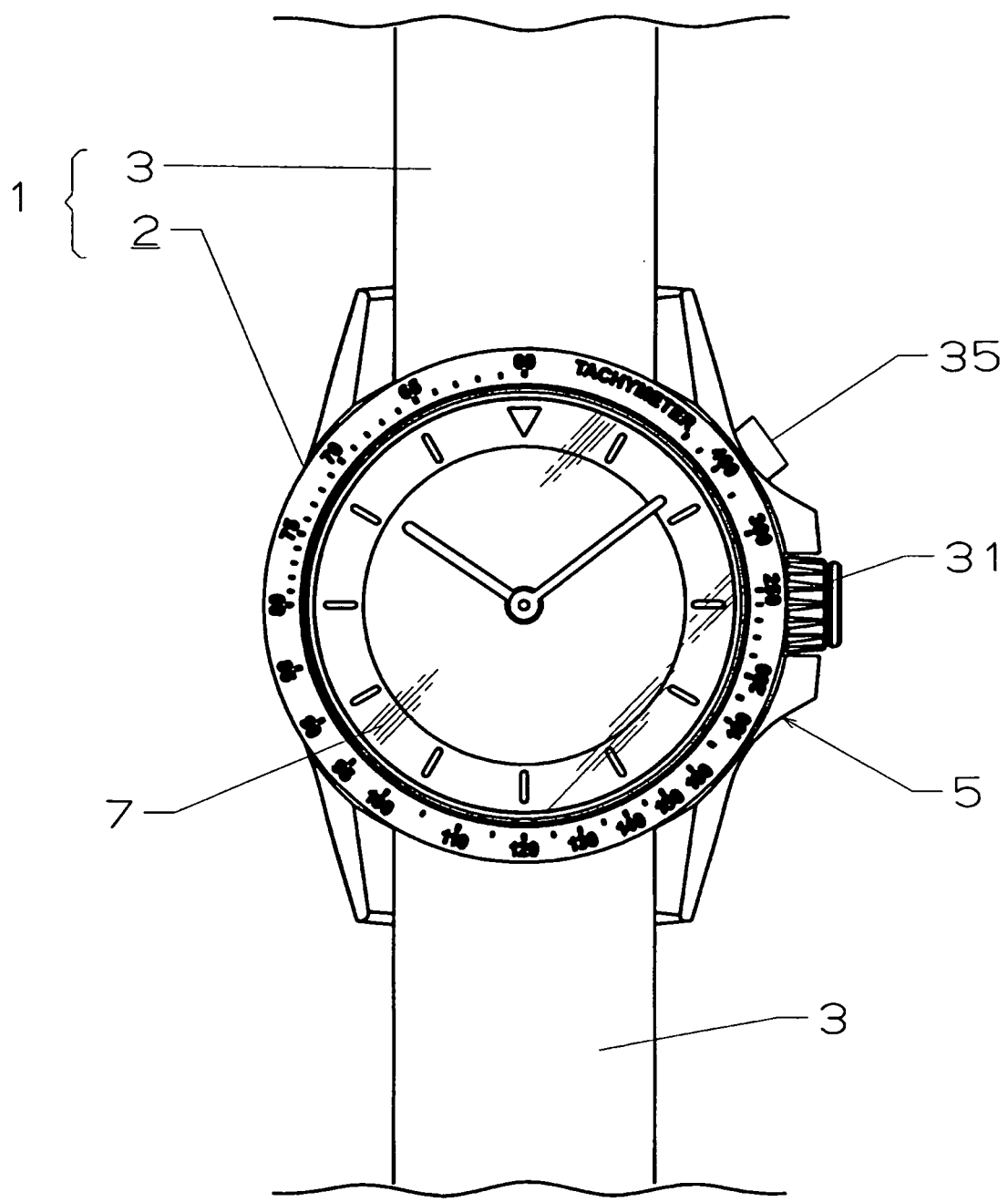
FIG. 1 is a front view showing a wrist watch according to a first embodiment of the present invention.
Figure 2:
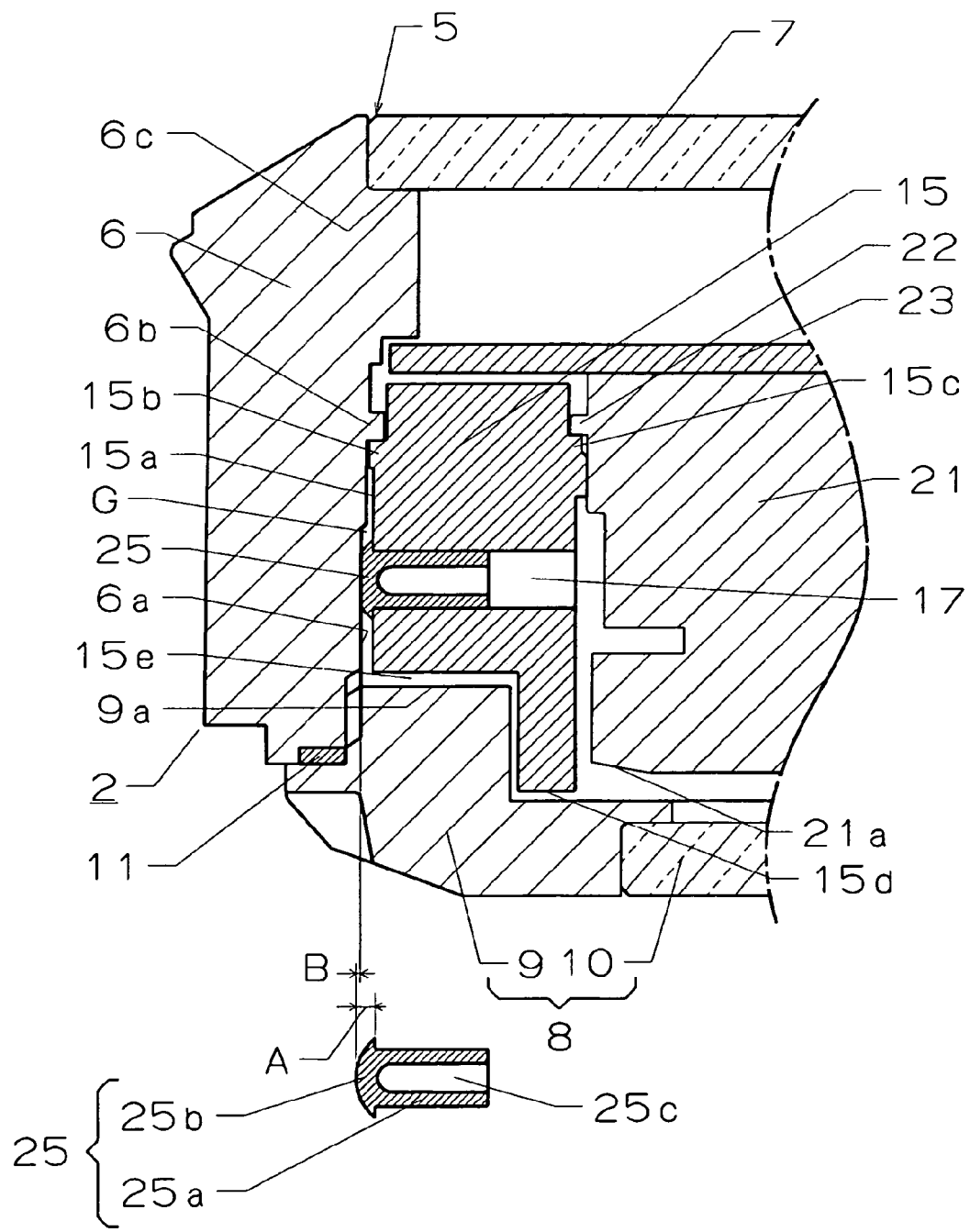
FIG. 2 is a cross-sectional view showing part of the wrist watch shown in FIG. 1.
Figure 3:
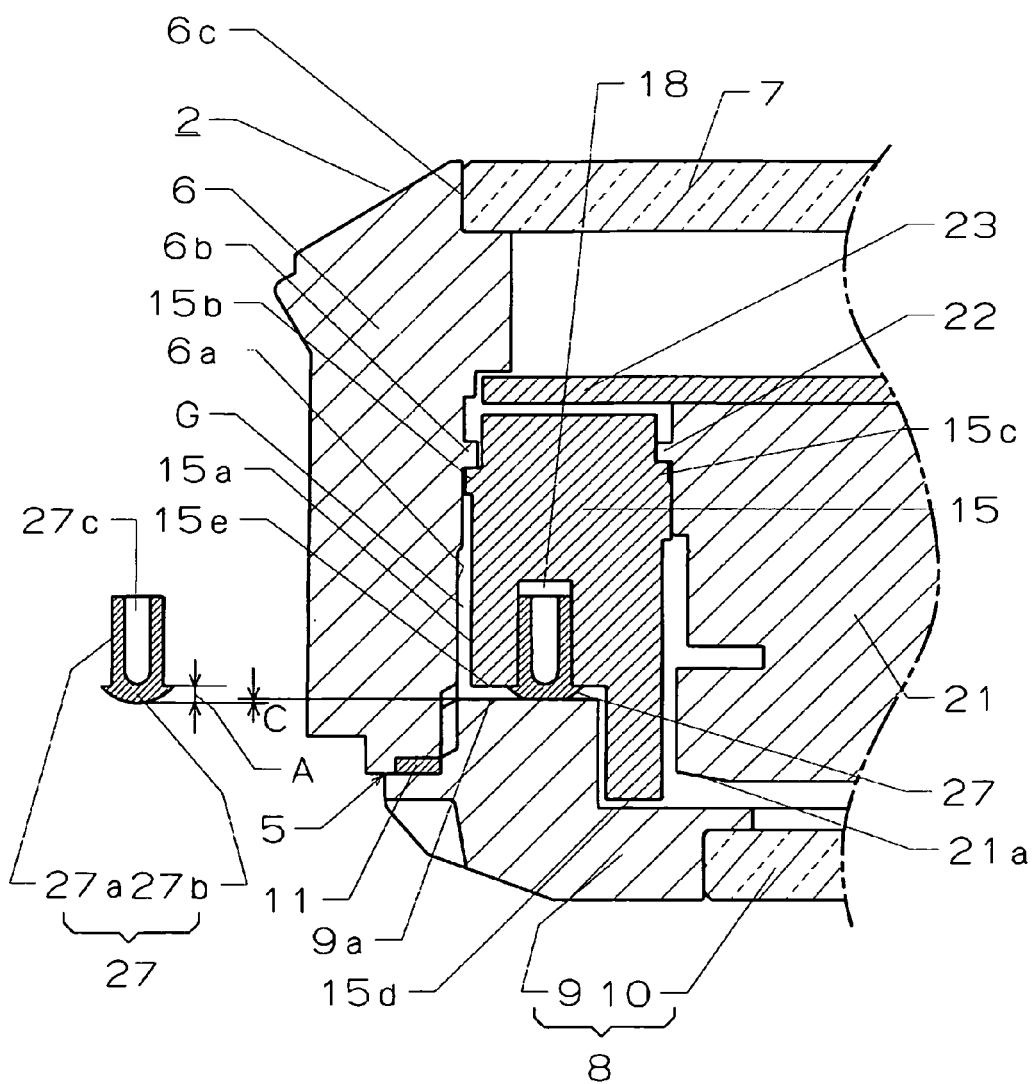
FIG. 3 is a cross-sectional view showing part of the wrist watch shown in FIG. 1 taken along a position different from that shown in FIG. 2.

Referring now to FIG. 1 to FIG. 5, a first embodiment of the present invention will be described in detail below. Reference numeral 1 in FIG. 1 denotes a timepiece, for example, a portable type meter, more specifically a wrist watch. A wrist watch 1 is formed by attaching a member for wearing on a wrist, for example, a band 3 on a watch body 2. As shown in FIG. 2 and FIG. 3, the watch body 2 includes a case 5, an inner frame 15, a movement 21, and a plurality of resilient bodies 25, resilient members 27, a crown 31 (see FIG. 1), and a push button 35 (see FIG. 1).

The case 5 is formed by assembling a glass 7 and a back lid 8 to a body 6. The body 6 is formed of a metal, and has a circular inner peripheral surface 6a. The body 6 is formed integrally with a receiving portion 6b on the inner peripheral surface 6a. The receiving portion 6b is formed of an inward projecting portion projecting inward from the inner peripheral surface 6a of the body 6. Also, the receiving portion 6b is formed into an annular shape formed continuously in the circumferential direction along the inner peripheral surface 6a in a seamless manner.

The glass 7 is mounted to close one end portion of the body 6 in the thickness direction by the peripheral portion thereof being fitted to an annular groove 6c formed continuously in the circumferential direction in seamless manners at an end portion of the front side of the body 6. The back lid 8 is screwed into a female screw portion formed on an end portion of the back side of the body 6 and is fitted to close one end portion of the body 6 in the thickness direction. The back lid 8 includes a metallic ring member 9 which forms a peripheral portion thereof and has a male screw portion, and a transparent member 10 attached by being fitted to the ring member 9.

Therefore, the wrist watch 1 is formed into a skeleton type which allows seeing the interior of the case 5 through the transparent member 10. The transparent member 10 is formed of glass. For reference sake, reference numeral 11 in FIG. 2 and FIG. 3 denotes an annular packing for sealing, which is clamped between the body 6 and the back lid 8.

Figure 4:
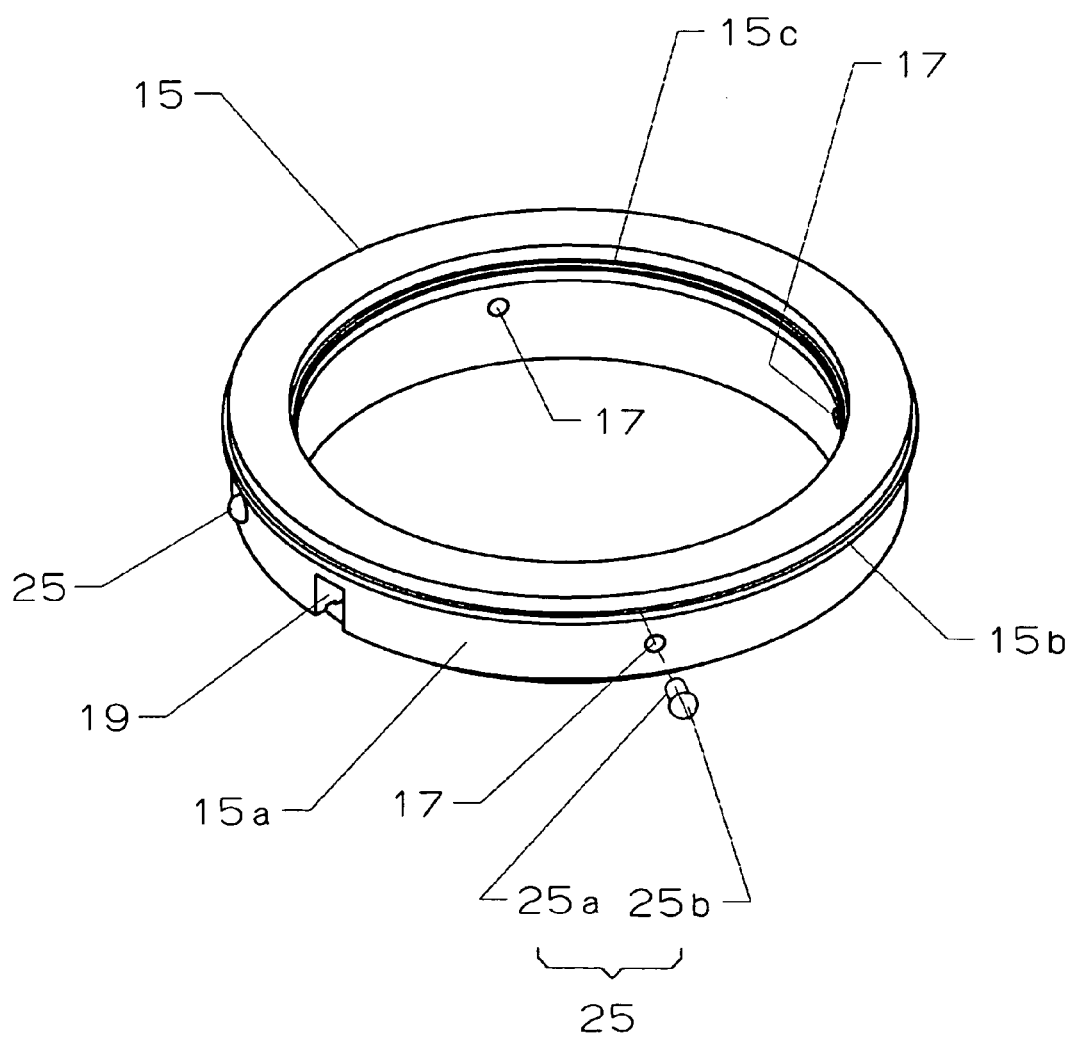
FIG. 4 is a perspective view showing an inner frame provided in the wrist watch shown in FIG. 1 together with a resilient body attached thereto viewed from the front side.
Figure 5:
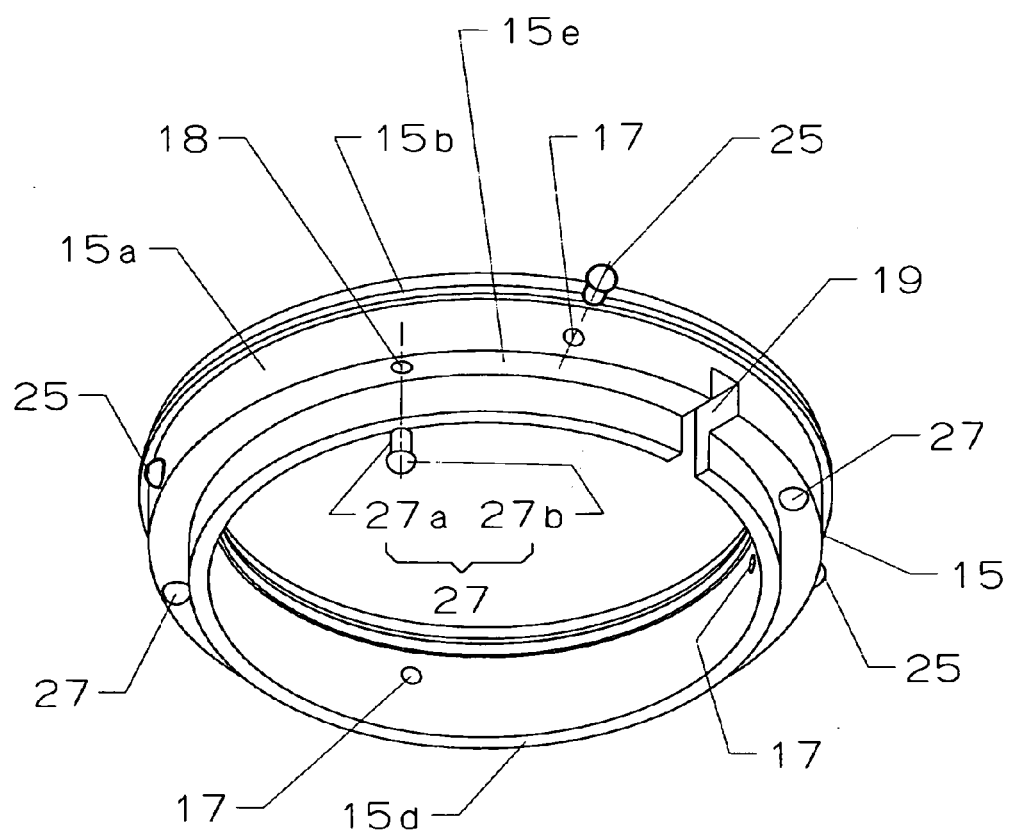
FIG. 5 is a perspective view showing the inner frame provided in the wrist watch shown in FIG. 1 together with the resilient body and a resilient member attached thereto viewed from the back side.

The inner frame 15 is formed of a metal, and is an annular shape as shown in FIG. 4 and FIG. 5. Formed integrally on a circular outer peripheral surface 15a of the inner frame 15 is an engaging portion 15b. The engaging portion 15b is formed into an outward projecting portion projecting for example outward from the outer peripheral surface 15a and is formed into an annular shape continuing in the circumferential direction along the outer peripheral surface 15a in a seamless manner. In addition, the engaging portion 15b is provided nearer an upper portion of the inner frame 15, that is, the glass 7. The engaging portion 15b is formed so as to be engaged with the receiving portion 6b from the back lid side. The diameter of the engaging portion 15b, which is the maximum diameter of the inner frame 15, is larger than the inner diameter of the receiving portion 6b and substantially the same as the diameter of the inner peripheral surface 6a. The diameter of the outer peripheral surface 15a of the inner frame 15 is smaller than the diameter of the inner peripheral surface 6a of the body 6.

As shown in FIG. 2 and FIG. 3, a supporting portion 15c is provided on an inner peripheral surface of the upper portion of the inner frame 15. The supporting portion 15c is formed of an annular shoulder continuously in the circumferential direction in a seamless manner. The inner frame 15 is integrated into the body 6 by bringing the engaging portion 15b into contact (engagement) with the receiving portion 6b in a state of the engaging portion being hooked from the backside. A gap G is defined between the outer peripheral surface 15a of the inner frame 15 integrated in the body 6 and the inner peripheral surface 6a of the body 6, and a lower portion of the inner frame 15 is released from the ring member 9 of the back lid 8. In addition, at least part of a lower end surface 15d of the inner frame 15 integrated in the body 6 faces the transparent member 10.

The inner frame 15 includes a plurality of, for example, four mounting bores 17 on the lower portion of the inner frame 15. The mounting bores 17 are positioned on the lower side with respect to the engaging portion 15b, and are provided with intervals, preferably, equidistantly in the circumferential direction of the inner frame 15. The mounting bores 17 are formed into circular bores, extend in the radial direction of the inner frame 15, and both ends thereof are opened from the inner peripheral surface and the outer peripheral surface 15a of the inner frame 15, respectively.

The inner frame 15 includes a plurality of, for example, four mounting holes 18 on the lower portion of the inner frame 15. The mounting holes 18 are positioned on the lower side with respect to the engaging portion 15b, and are provided with intervals, preferably, equidistantly in the circumferential direction of the inner frame 15. As shown in FIG. 4 and FIG. 5, the mounting holes 18 and the mounting bores 17 are shifted in the circumferential direction of the inner frame 15. Also, the mounting holes 18 are formed of circular holes and extend in the direction of thickness of the inner frame 15, and lower ends thereof are opened from a lower surface 15e of the inner frame 15 opposing an upper surface 9a of the ring member 9 of the back lid 8 in the proximity thereto. The diameters of the mounting holes 18 and the diameters of the mounting bores 17 are the same. For reference sake, the lower surface 15e is provided at a level higher than the lower end surface 15d of the inner frame 15. Also, reference numeral 19 in FIG. 4 and FIG. 5 denotes a setting stem undercut.

The movement 21 is a mechanical movement. A detailed configuration of the movement 21 has no relation with the present invention and, the movement 21 is shown as a block and hatched in FIG. 2 and FIG. 3 for the sake of easy understanding of these drawings.

The movement 21 is supported inside the inner frame 15 with a projecting portion 22 provided continuously in the circumferential direction on an outer peripheral portion thereof in a state of the projecting portion 22 being hooked on the supporting portion 15c of the inner frame 15 from above (from the side of the glass). The movement 21 includes a dial 23. Also, the movement 21 includes a switch (not shown) which assumes an ON state only while being pressed. By turning this switch ON, predetermined functions, for example, illumination of the dial 23 is achieved.

For reference sake, a peripheral lower surface 21a of the movement 21 and the lower end surface 15d of the inner frame 15 surrounding the lower surface are applied with engraving (not shown). Accordingly, when the operation of the movement 21 is viewed through the transparent member 10, the peripheral lower surface 21a and the lower end surface 15d, which are engraved surfaces, are both viewed, so that the design of the wrist watch 1 is enhanced. However, the decorative engraving may be omitted.

The resilient bodies 25 are integral molds formed of DURACON (product name), or hard rubber or the like which are resiliently deformable, and each includes a base 25a which constitutes a mounting portion and a head 25b which forms a buffering portion provided at one end of the base 25a. The shape of the cross section orthogonal to the axial direction of the base 25a matches the shape of the cross section of the mounting bore 17, and is, for example, a circular shape. Also, the axial length of the base 25a is shorter than the length of the mounting bore 17.

The base 25a includes a hollow portion 25c, and is formed into a cylindrical shape. The hollow portion 25c is formed with the head 25b as a bottom, and is opened at the other end of the base 25a. The head 25b is formed into a semispherical shape having a diameter larger than the base 25a and the mounting bore 17.

The resilient bodies 25 are attached to the inner frame 15 by inserting the bases 25a tightly into the mounting bores 17 from the outside of the inner frame 15 until the back surface of the heads 25b come into contact with the outer peripheral surface 15a of the inner frame 15. In this attachment, the bases 25a are, owing to the presence of the hollow portions 25c, resiliently deformed and inserted easily into the mounting bores 17. Accordingly the resilient bodies are easily attached to the inner frame 15 in comparison with the case where the bases 25a are solid (filled). After the attachment, since the bases 25a are kept in tight contact with the inner surfaces of the mounting bores 17 in a state of the base being resiliently deformed, the resilient bodies 25 are kept so as not to be disconnected unintentionally from the mounting bores 17.

As described above, through only the work of inserting the bases 25a of the resilient bodies 25 into the mounting bores 17 of the inner frame 15 from the outside of the inner frame 15 until the heads 25b of the resilient bodies 25 come into contact with the outer peripheral surface 15a of the inner frame 15, the resilient bodies 25 can be attached to the inner frame 15 easily without necessity of screwing or adhesion. In addition, since the bases 25a are each formed into a cylindrical shape and the heads 25b are each formed into a semispherical shape, there is no directionality in the circumferential direction when inserting the resilient bodies 25 into the circular mounting bores 17. Therefore, in this point as well, attachment of the resilient bodies 25 to the inner frame 15 is easy.

In a state in which the resilient bodies 25 are attached to the inner frame 15, the semispherical heads 25b are each tapered so that a projecting length A from the outer peripheral surface 15a of the inner frame 15 is increased from the peripheral edge toward the center. The projecting length A in a state before the inner frame 15 is integrated into the case 5 is set to be longer than the gap G. Therefore, the diameter of the circle (not shown) passing through the distal ends of the heads 25b of the resilient bodies 25 is larger than the diameter of the engaging portion 15b and the diameter of the inner peripheral surface 6a of the body 6.

Resilient members 27 are integral molds formed of DURACON (product name), or hard rubber or the like which are resiliently deformable in the same manner as the resilient bodies 25, and each includes a base 27a and a head 27b provided at one end of the base 27a. The shape of the cross section orthogonal to the axial direction of the base 27a matches the shape of the cross section of the mounting hole 18, and is, for example, a circular shape. Also, the axial length of the base 27a is shorter than the length of the mounting hole 18.

The base 27a includes a hollow portion 27c, and is formed into a cylindrical shape. The hollow portion 27c is formed with the head 27b as a bottom, and is opened at the other end of the base 27a. The head 27b is formed into a semispherical shape having a diameter larger than the base 27a and the mounting hole 18.

The resilient members 27 and the resilient bodies 25 have the same structure. Accordingly, easiness of manufacture of components is realized. In other words, the resilient bodies 25 and the resilient members 27 formed using the same molding die can be used, and the mounting bores 17 and the mounting holes 18 for inserting and attaching the resilient bodies 25 and the resilient members 27 can be machined on the inner frame 15 using the same punching tool.

The resilient members 27 are attached to the inner frame 15 by inserting the bases 27a tightly into the mounting holes 18 from the outside of the inner frame 15 until the back surface of the head 27b comes into contact with the lower surface 15e of the inner frame 15. In this attachment, attachment of the resilient members 27 to the inner frame 15 is easily achieved because the bases 27a are, owing to the presence of the hollow portions 27c, resiliently deformed and inserted easily into the mounting holes 18 in comparison with the case where the bases 27a are solid (filled). After the attachment, since the bases 27a are kept in tight contact with the inner surfaces of the mounting holes 18 in a state of the base 27a being resiliently deformed, the resilient members 27 are kept so as not to be disconnected unintentionally from the mounting holes 18.

As described above, through only the work of inserting the bases 27a of the resilient members 27 into the mounting holes 18 of the inner frame 15 from the outside of the inner frame 15 until the heads 27b of the resilient members 27 come into contact with the outer peripheral surface 15a of the inner frame 15, the resilient members 27 can be attached to the inner frame 15 easily without necessity of screwing or adhesion. In addition, since the bases 27a are each formed into a cylindrical shape and the heads 27b are each formed into a semispherical shape, there is no directionality in the circumferential direction when inserting the resilient members 27 into the mounting holes 18. Therefore, in this point as well, attachment of the resilient members 27 to the inner frame 15 is easy.

The inner frame 15 having the resilient bodies 25 and the resilient members 27 attached thereto is integrated into the case 5 by being inserted into the body 6 in a state in which the back lid 8 is not attached from the side on which the inner frame 8 is attached with the movement 21 supported inside thereof. The depth of insertion is determined by the engaging portion 15b of the inner frame 15 coming into contact with the receiving portion 6b of the body 6.

With the assembling operation described above, the heads 25b of the resilient bodies 25 are clamped between the inner peripheral surface 6a of the body 6 and the outer peripheral surface 15a of the inner frame 15, and are held in a state of being compressed and resiliently deformed so as to match the gap G between the inner peripheral surface 6a and the outer peripheral surface 15a. Accordingly, the inner frame 15 is assembled so as to restrain the inner frame 15 from rattling in the radial direction with respect to the body 6 of the case 5. Reference symbol B in FIG. 2 shows a dimension of the resiliently deformed and compressed head 25b (this is also referred to as tightening margin).

As described above, the gap G is defined between the outer peripheral surface 15a of the inner frame 15 integrated in the body 6 and the inner peripheral surface 6a of the body 6, and the heads 25b of the resilient bodies 25 clamped between the inner peripheral surface 6a and the outer peripheral surface 15a can be resiliently deformed. Therefore, in a state in which the back lid 8 is not mounted, the inner frame 15 supporting the movement 21 can be attached and detached with respect to the body 6 while resiliently deforming the heads 25b of the resilient bodies 25 attached thereto. In other words, the wrist watch 1 can be disassembled and assembled.

The hollow portion 25c of each of the resilient bodies 25 forms a bottom of the heads 25b, and therefore, the heads 25b can easily be resiliently deformed at the time of assembly described above in comparison with the case where the bases 25a are solid (filled). Accordingly, the inner frame 15 having the resilient bodies 25 attached thereto and supporting the movement 21 can easily be assembled in the body 6. Also, from the same reasons, at the time of disassembling the wrist watch 1, the inner frame 15 with the resilient bodies 25 can easily be removed from the body 6 together with the movement 21.

In addition, since the heads 25b of the resilient bodies 25 are each have a semispherical shape, the heads 25b of the resilient bodies 25 can hardly be caught by an opening edge on the side of the back lid of the body 6 when inserting the inner frame 15 with the resilient bodies 25 into the body 6. Also, since the contact of the heads 25b with respect to the inner peripheral surface 6a of the body 6 is point contact, frictional resistance of the heads 25b with respect to the inner peripheral surface 6a is lower than the case of linear contact. Therefore, in this point as well, the inner frame 15 with the resilient bodies 25 can be assembled easily into the body 6. Also, because of the low frictional resistance as described above, at the time of disassembly of the wrist watch 1, the inner frame 15 with the resilient bodies 25 can be removed easily from the body 6.

After the assembly of the inner frame 15, the back lid 8 is attached to the body 6 by being screwed, so that the case 5 is assembled. With this assembly, the ring member 9 of the back lid 8 presses the heads 27b of the resilient members 27, so that the heads 27b are clamped between the lower surface 15e of the inner frame 15 and the upper surface 9a of the ring member 9, thereby being kept in a resiliently deformed state. Accordingly, the engaging portion 15b is pressed against the receiving portion 6b, and the inner frame 15 is held in a state of it being restrained from rattling in the direction of thickness with respect to the case 5. Reference symbol C in FIG. 3 shows a dimension of the head 27b compressed by being resiliently deformed (this is referred to as tightening margin).

As described above, according to the wrist watch 1 which can be disassembled and assembled, an anti-shock property of the movement 21 can be improved in spite of the fact that the gap G is defined between the outer peripheral surface 15a of the inner frame 15 and the inner peripheral surface 6a of the body 6.

In other words, since the inner peripheral surface 6a and the outer peripheral surface 15a clamp the heads 25b of the resilient bodies 25 attached to the inner frame 15 in the resiliently deformed state, the heads 25b function as spacers. Therefore, the inner frame 15 and the movement 21 supported thereby are restrained from moving in the radial direction of the body 6 with respect to the body 6 due to the gap G. In addition, since the heads 25b of the resilient bodies 25 having the tightening margin can be resiliently deformed, in the event of falling of the wrist watch 1 or the like, the impact along the radial direction of the body 6 resulting therefrom can be alleviated by the resilient deformation of the heads 25b.

In addition, the wrist watch 1 includes the resilient members 27 clamped between the inner frame 15 which supports the movement 21 and the back lid 8 of the case 5 in a state of the resilient member being resiliently deformed. The resilient members 27 restrain the inner frame 15 from moving in the thickness direction of the body 6 unintentionally and, in the event of falling of the wrist watch 1 or the like, the impact along the direction of thickness of the body 6 resulting therefrom can be alleviated by the resilient deformation of the heads 27b of the resilient members 27.

Therefore, according to the wrist watch 1 having the configuration described above, even though the inner frame 15 is formed of a metal and the movement 21 is of a mechanical type and hence they have heavy weights, improvement of the anti-shock property of the movement 21 is achieved. In addition, neither of the resilient bodies 25 nor the resilient members 27 are the metallic leaf springs, and they are resiliently deformed while being compressed, so that the resiliency is not deteriorated over a long term and is hardly withered. Therefore, the anti-shock property as described above can be held for a long time.

Also, as shown in FIG. 1, the case 5 is provided with the crown 31 and the push button 35 so as to allow the operation from the outside thereof. The crown 31 is connected to the movement 21 via a setting stem, not shown. The crown 31 can be operated by rotating, pushing and pulling the same. Adjustment or the like of the time instance or the date of the movement 21 is performed by the operation of the crown 31. The push button 35 is arranged in the vicinity of the crown 31, and is disposed so as to be pushed inward. By pushing the push button 35 inward, a switch, not shown, of the movement 21 is turned ON.

The operating force to push the crown 31 inward is generally larger than the operating force to push the push button 35 inward, and these members are pushed inward toward the center of the case 5. Accordingly, if the movement 21 moves in the case 5 in the direction toward 3 o'clock or 9 o'clock due to the above-described gap G in association of pushing and pulling operation of the crown 31, the position of the switch of the movement 21 varies with respect to the push button 35, and hence the switch may not be operated normally even when the push button 35 is pushed inward.

However, the inner frame 15 supporting the movement 21 as described above is held so as not to move in the radial direction of the body 6 owing to the heads 25b of a plurality of the resilient bodies 25. Accordingly, the position of the switch of the movement 21 is restrained from being displaced from the correct position irrespective of the pushing and pulling operation of the crown 31. Therefore, when the push button 35 is subject to the pushing operation, the switch can be turned ON with a high reliability.

Also, in the manufacture of the wrist watch 1, there is a case where various types of the wrist watches 1 having the same movements 21 but being different in size of the cases 5 are manufactured. In this case, the inner frames which are adapted to the sizes of the cases must be prepared. However, by preparing inner frames having sizes such that the gap between the outer peripheral surface of the inner frame and the inner peripheral surface of the body of the case becomes the same as the gap G of the wrist watch 1 having the configuration described above, a plurality of the resilient bodies to be attached to the inner frames may be the same as the resilient bodies 25 used in the wrist watch 1 having the configuration described above.

Accordingly, the resilient bodies 25 molded by using the same molding die may be used as components commonly usable for a plurality of types of wrist watches having the cases 5 of different sizes. Therefore, since increase in number of components required for manufacturing a number of types of timepieces may be restrained, the manufacturing cost may be reduced in association with facilitation of component management or the like.

Figure 6:
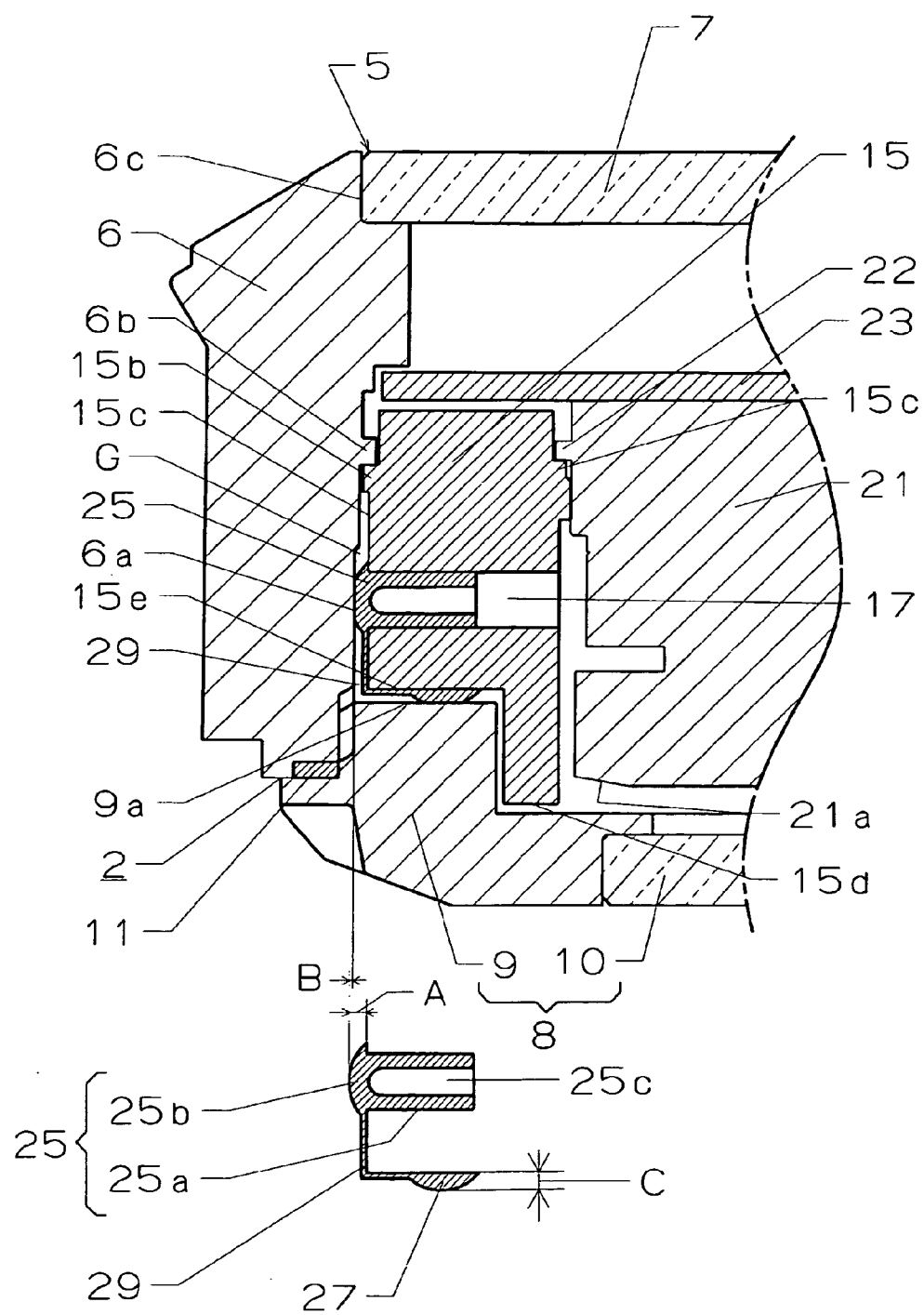
FIG. 6 is a cross-sectional view showing part of a wrist watch according to a second embodiment of the present invention.

FIG. 6 shows a second embodiment of the present invention. Since the second embodiment is the same as the first embodiment other than those described below, the same configuration and the configurations having the same functions as those in the first embodiment are denoted by the same reference numerals as in the first embodiment and description will be omitted.

In the second embodiment, the resilient body 25 and the resilient member 27 are integrally formed. In other words, the resilient body 25 and the resilient member 27 are formed integrally via a connecting portion 29 connected integrally at one end thereof to the head 25b of the resilient bodies 25 and connected integrally at the other end thereof to the resilient members 27. The connecting portion 29 is thinner than the gap G, and is disposed along the lower portion of the outer peripheral surface 15a of the inner frame 15 and the lower surface 15e, which is the back surface of the inner frame 15 continuing therefrom. Also, in the second embodiment, the resilient member 27 is formed into a filled semispherical shape. The resilient member 27 corresponds to the head of the resilient member described in the first embodiment.

In the wrist watch 1 according to the second embodiment, the configurations other than those described above are the same as in the first embodiment including the configurations which is not shown in FIG. 6. Therefore, since the wrist watch in the second embodiment achieves the same effects as that in the first embodiment, improvement of the anti-shock property of the movement 21 can be achieved in spite of the fact that the disassembly and assembly are possible because of the reasons described already in the first embodiment.

In addition, in the second embodiment, since the resilient bodies 25 which serve to stop the movement of the inner frame 15 in the radial direction of the body 6 and the resilient members 27 which serve to stop the movement of the inner frame 15 in the thickness direction of the body 6 are integrally formed, the number of components which serve to stop the movement of the inner frame 15 in the event of falling the wrist watch 1 or the like can be reduced. Accordingly, the manufacturing cost may be reduced in association with the facilitation of the component management or the like.

In addition, since the resilient members 27 are overlapped with the lower surface 15e of the inner frame 15 and held by the connecting portions 29, it is not necessary to insert the resilient members 27 into the inner frame 15 and hold the same in order to hold the resilient members 27 in the inner frame 15. Therefore, mounting holes for holding the resilient members 27 are not required in the inner frame 15, and a work to insert and attach the resilient members 27 into the mounting holes is not necessary as well, so that the cost reduction is achieved from this point of view.

What is claimed is:

1. A timepiece comprising:
   a case including a body having an annular receiving portion on an inner peripheral surface thereof, a glass attached to the body at one end portion in the thickness direction, and a back lid attached to the body at the other end portion in the thickness direction;
   an inner frame which has an engaging portion on an outer peripheral surface thereof and which is integrated in the case by engaging the engaging portion with the receiving portion from the side of the back lid such that a gap is formed between the inner peripheral surface of the body and the outer peripheral surface of the inner frame;
   a movement supported inside the inner frame; and
   a plurality of resilient bodies attached at a plurality of positions to the inner frame, respectively, and projecting from the outer peripheral surface into the gap, the resilient bodies being clamped in a resiliently deformed state between the inner peripheral surface of the body and the outer peripheral surface of the inner frame.

2. The timepiece according to claim 1, wherein the inner frame includes a plurality of mounting bores extending in the radial direction thereof, the resilient bodies each include a base inserted into the mounting bore and a head having a diameter larger than the base and the mounting bore and provided integrally at one end of the base, and the resilient bodies are attached to the inner frame with the bases inserted into the mounting bores and the heads projected from the outer peripheral surface.

3. The timepiece according to claim 2, wherein each of the bases has a cylindrical shape having a hollow portion bottomed by the head, and the hollow portion is opened to the other end of the base.

4. The timepiece according to claim 2, wherein the heads of the resilient bodies have a semispherical shape.

5. The timepiece according to claim 1, further comprising resiliently deformable resilient members, separate from and unattached to the resilient bodies, clamped in a resiliently deformed state between the inner frame and the back lid.

6. The timepiece according to claim 5, wherein the resilient members are each attached by being inserted into a mounting hole provided en in the inner frame.

7. The timepiece according to claim 6, wherein each mounting hole and the mounting bore have the same diameter, and each resilient body and resilient member have the same configuration.

8. The timepiece according to claim 5, wherein the resilient members are integrally formed with respective ones of the resilient bodies.

9. The timepiece according to claim 1, wherein the movement includes a switch, a crown attached to the case and configured to operate the movement, and a push button attached to the case and positioned in the vicinity of the crown and configured to turn the switch ON.

10. The timepiece according to claim 1, wherein the receiving portion of the body comprises an annular inward projecting portion and the engaging portion of the inner frame comprises an annular outward projecting portion that abuts with an underside of the annular inward projecting portion.

11. The timepiece according to claim 10, wherein the resilient bodies comprise molded bodies slidably inserted into bores provided in the inner frame, each molded body having a head that projects into the gap and that is clamped in a resiliently deformed state between the inner peripheral surface of the body and the outer peripheral surface of the inner frame.

12. The timepiece according to claim 11, wherein the heads of the resilient bodies have a semispherical shape.

13. The timepiece according to claim 11, further comprising resiliently deformable resilient members, separate from and unattached to the resilient bodies, clamped in a resiliently deformed state between the inner frame and the back lid.

14. The timepiece according to claim 11, wherein the resilient members comprise molded bodies slidably inserted into bores provided in the inner frame.

15. The timepiece according to claim 14, wherein the resilient bodies and the resilient members have the same configuration.

16. The timepiece according to claim 15, wherein the resilient bodies and the resilient members have semispherically-shaped heads.

* * * * *